(12) United States Patent
Luchterhand et al.

(10) Patent No.: US 10,862,267 B2
(45) Date of Patent: Dec. 8, 2020

(54) METHOD FOR CONTROLLING THE EMISSION FREQUENCY OF A LASER

(71) Applicant: HUMEDICS GMBH, Berlin (DE)

(72) Inventors: Axel Luchterhand, Berlin (DE); Alexander Helmke, Berlin (DE); Tom Rubin, Berlin (DE); Karsten Heyne, Beelitz (DE)

(73) Assignee: HUMEDICS GMBH, Berlin (DE)

( * ) Notice: Subject to any disclaimer, the term of this patent is extended or adjusted under 35 U.S.C. 154(b) by 60 days.

(21) Appl. No.: 16/303,107

(22) PCT Filed: May 19, 2017

(86) PCT No.: PCT/EP2017/062125
§ 371 (c)(1),
(2) Date: Nov. 19, 2018

(87) PCT Pub. No.: WO2017/198827
PCT Pub. Date: Nov. 23, 2017

(65) Prior Publication Data
US 2019/0305514 A1    Oct. 3, 2019

(30) Foreign Application Priority Data
May 20, 2016  (DE) .......................... 10 2016 208 754

(51) Int. Cl.
*H01S 5/0687*    (2006.01)
*H01S 3/13*    (2006.01)
(Continued)

(52) U.S. Cl.
CPC .......... *H01S 5/0687* (2013.01); *H01S 3/1303* (2013.01); *H01S 5/024* (2013.01);
(Continued)

(58) Field of Classification Search
CPC .. H01S 5/0687; H01S 5/06835; H01S 5/1303; H01S 5/0612; H01S 3/1028;
(Continued)

(56) References Cited

U.S. PATENT DOCUMENTS

| 6,125,128 A | * | 9/2000 | Mizrahi | ................ | H01S 5/0687 |
| | | | | | 372/20 |
| 2002/0041611 A1 | * | 4/2002 | May | ...................... | H01S 5/0687 |
| | | | | | 372/29.02 |

(Continued)

FOREIGN PATENT DOCUMENTS

| EP | 0 665 660 A1 | 8/1995 |
| EP | 0 845 166 B1 | 2/2004 |

*Primary Examiner* — Joshua King
(74) *Attorney, Agent, or Firm* — Maschoff Brennan

(57) ABSTRACT

A method for controlling the emission frequency of a laser comprises: recording a first spectrum by passing a laser light emitted by the laser through a sample onto a detector, the detector being connected to a multichannel analyzer which assigns pulses detected by the detector to a channel; determining a first channel to which the maximum of a first signal in the first spectrum has been assigned; determining a second channel to which the maximum of a second signal in the first spectrum has been assigned; recording a second spectrum in analog fashion like the first spectrum; determining whether the maximum of the first signal in the second spectrum has been assigned to the first channel and whether the maximum of the second signal in the second spectrum has been assigned to the second channel; adjusting the operating temperature of the laser in the event of deviations determined in the previous step.

10 Claims, 3 Drawing Sheets

(51) Int. Cl.
  *H01S 5/024* (2006.01)
  *H01S 5/34* (2006.01)
(52) U.S. Cl.
  CPC .............. *H01S 5/34* (2013.01); *H01S 5/3402* (2013.01); *H01S 5/02415* (2013.01)
(58) Field of Classification Search
  CPC ................. H01S 3/1317; H01S 3/1303; H01S 5/3401–3042
  See application file for complete search history.

(56) References Cited

U.S. PATENT DOCUMENTS

| | | | | |
|---|---|---|---|---|
| 2002/0043616 A1* | 4/2002 | May | ...................... | H01S 5/0687 250/226 |
| 2002/0044575 A1* | 4/2002 | May | ...................... | H01S 5/0687 372/20 |
| 2002/0097760 A1* | 7/2002 | May | .......................... | G01J 3/02 372/18 |
| 2003/0123065 A1* | 7/2003 | Park | .......................... | G01J 9/04 356/484 |
| 2003/0174743 A1* | 9/2003 | Cliche | .................. | H04B 10/504 372/20 |
| 2009/0268272 A1* | 10/2009 | Wang | ................... | H04B 10/505 359/276 |

* cited by examiner

METHOD FOR CONTROLLING THE EMISSION FREQUENCY OF A LASER

This application is a National Phase Patent Application of International Patent Application Number PCT/EP2017/062125, filed on May 19, 2017, which claims priority of German Patent Application Number 10 2016 208 754.1, filed on May 20, 2016.

BACKGROUND

The present invention relates to a method for controlling the emission frequency of a laser.

Lasers are used, for example, in spectroscopy. The emission frequency of a laser is the frequency of the light emitted by the laser. Lasers change their properties due to external influences. This leads in particular to a change in the light frequency (emission frequency). The changes of the light frequency can be in the range of hundreds of wavenumbers; in case of well-adjusted lasers they are only a few wavenumbers or even smaller.

However, even frequency fluctuations of less than one wavenumber can cause significant problems with spectrally high-resolution measurements. For example, semiconductor lasers in the infrared spectral range or quantum cascade lasers are very narrow-band light sources with a half-width of less than 1 $cm^{-1}$ (also 0.01 $cm^{-1}$ or better). Although these lasers are mostly temperature-stabilized, changes in temperature in the environment lead to frequency changes of the laser. These changes can be very small, up to a few wavenumbers, e.g. 0.005 $cm^{-1}$, 0.01 $cm^{-1}$, 0.02 $cm^{-1}$, 0.05 $cm^{-1}$, 0.1 $cm^{-1}$, 0.2 $cm^{-1}$ or larger.

With a quantum cascade laser (QCL), such as a DFB laser (DFB stands for the technical term "distributed feedback"), which can generate laser light with an emission frequency width of about 0.01 $cm^{-1}$ in a spectral range with a width of about 30 $cm^{-1}$, the emission frequency depends strongly on the layer thickness and sequence of the individual layers in the laser medium. Thereby, only a small spectral range from the entire spectral width (about 30 $cm^{-1}$) is amplified. Similar dependencies also exist for other lasers (for example ICL (ICL stands for the technical term "interband cascade laser")). By changing the temperature of the laser, the layer thickness changes due to thermal expansion, but also the refractive index of the laser medium. This changes the emission frequency of the laser (hereinafter also referred to as laser frequency). This dependency is often used by applying a heating voltage to the laser medium. Heating voltage is the application of a voltage or current to the laser. This voltage or current leads to a heating of the laser due to Ohm's law, whereby the temperature and also the laser frequency change. The voltage or current can be constant, linearly increasing or comprise a modulation.

It has therefore long been known that the temperature variation changes the emission frequency of the laser. Thus, the emission frequency can be changed and a spectrum can be measured by temperature variation, which for example is generated by a current flow through the laser.

A single measurement of the spectrum can thus be easily performed. However, in practice all experiments are repeated (several times) in order to achieve statistics of measurement results with error consideration and an improvement of the signal-to-noise ratio.

However, two measurements of the spectrum can only be compared if the frequency range is the same, the frequency distances of individual measurement points are the same and the measured values can be compared. It must be possible to repeat the experiment under the same conditions. This is not the case if the properties of the laser change, for example the frequency range and other properties such as the absolute position of the emission frequency, the background and the non-linearity of the laser properties.

To stabilize the temperature of a laser, a Peltier element is regularly used, which can heat or cool the laser. The temperature is measured on a copper block on which the laser is mounted. However, this is associated with a certain inaccuracy, since the copper block only reflects a temperature change of the laser with a delay. Furthermore, external influences acting on the copper block can interfere with the exact temperature determination of the laser.

A laser wavelength control system for stabilizing a laser output wavelength is known from EP 0 845 166 B1. This system has a reflector/filter device and a controller. The controller uses a signal that has passed the reflector/filter device and a signal that has been reflected from the reflector/filter device to stabilize the laser output wavelength. The solution described in that European patent therefore requires an additional optical element in the form of a reflector/filter device to stabilize the laser output wavelength.

SUMMARY

The present invention is based on the problem of specifying a method for controlling the emission frequency of a laser which overcomes the previously discussed disadvantages and permits more precise control of the emission frequency.

This problem is solved by a method with features as described herein. Such a method makes it possible to determine the temperature of the laser via spectral properties so that environmental influences, which for example can result from a non-uniform temperature distribution in the copper block or from an inaccurate soldering of a temperature sensor on the copper block, are completely suppressed. Rather, the present method provides an objective measure of the temperature of a laser, namely the emission frequency of the laser itself.

The method for controlling the emission frequency of a laser claimed according to the invention, is characterized by several steps. First, a working temperature of the laser can optionally be set to a defined temperature value. This temperature value can be selected according to the respective requirements.

Now the actual procedure begins with the recording of a first spectrum of a sample in order to obtain measured values of the first spectrum. For this purpose, a light emitted by the laser is guided through the sample to a detector. The detector is connected to a multichannel analyzer that assigns the individual pulses detected by the detector to one channel at a time. The selection of the channels can, for example, be selected as a function of a current flow through the laser and an associated frequency shift of the emission frequency of the laser. The spectrum can, for example, be an absorption spectrum, a signal spectrum or a transmission spectrum. The spectrum contains different signals resulting from an interaction of the sample with the irradiated laser light. In the case of an absorption spectrum, the signals are absorption bands. Alternatively, the signals can also be referred to as peaks, absorption lines or lines.

Now a first channel is determined to which the maximum of a first signal in the first spectrum has been assigned by the multichannel analyzer. Preferably, the first channel is a channel with a low order number, since external influences caused, for example, by a varying current flow (e.g. a linearly increasing current intensity) through the laser, are relatively small with such a channel. A second channel is then determined to which the maximum of a second signal in the first spectrum has been assigned. Within the framework of the procedure described here, at least two signals, such as two absorption bands, are evaluated. In principle, however, it is possible to work with more than two signals, such as 3, 4, 5, 6, 7, 8, 9, 10 or more signals.

Now a second spectrum is recorded in the same way as the first spectrum in order to obtain measured values of the second spectrum. This means that the same sample is recorded under the same conditions with the same laser, detector and multichannel analyzer. Under ideal conditions, the second spectrum would now have to correspond exactly to the first spectrum. Under real conditions, however, there may be deviations between the first spectrum and the second spectrum, especially if there is a longer period between the recording of the first spectrum and the second spectrum during which the laser has experienced a temperature change, for example due to repeated measurements.

Now it is determined whether the maximum of the first signal in the second spectrum was again assigned to the first channel (like the maximum of the first signal in the first spectrum). The first signal of the second spectrum corresponds to the first signal of the first spectrum. It is also determined whether the maximum of the second signal in the second spectrum has been assigned to the second channel (like the maximum of the second signal in the first spectrum). The second signal in the second spectrum also corresponds to the second signal in the first spectrum. There are different approaches to this determination, which will be explained below.

The working temperature of the laser is then adjusted if deviations were detected in the previously explained determination step. The adjustment takes place in such a way that the maximum of the first signal in the second spectrum is assigned to the first channel. Alternatively or additionally, the maximum of the second signal in the second spectrum is assigned to the second channel as a result of the adjustment. A separate adjustment can also be made for this purpose as an option.

This method thus uses spectral information (namely a deviation of the position of the maximum of the first signal or the position of the maximum of the second signal by a comparison of the first spectrum with the second spectrum) to adapt the working temperature of the laser so that a further spectrum recorded after the second spectrum corresponds exactly to the first spectrum with respect to the maximum of the first signal and/or the maximum of the second signal. If this is achieved, it means that the emission frequency of the laser has the same value as when recording the first spectrum. An adaptive feedback control takes place, which makes it possible to precisely adjust the emission frequency of the laser on the basis of objective properties that are only dependent on the laser itself.

Any absorption band of a gas can be used as the first signal and/or as the second signal. The described method is suitable for application in different spectroscopy methods. For example, it can be used for spectroscopic methods in the mid-infrared range or in the near-infrared range. The first signal and the second signal can be, for example, a rotation band, a rotation vibration band or overtones of such bands.

The smaller the half-width of a signal, the more suitable it is for use in the control procedure described. For example, a reference cell can be used in which a gas is stored at a low pressure. This results in a narrow line width and thus a particularly advantageous control of the emission frequency of the laser used.

Alternatively, other measurement methods can be used to determine the frequency position of the laser. Instead of the position of absorption bands, measurement results from a spectrometer, an etalon (e.g. a Fabry-Perot Etalon), or a frequency-selective photodiode can also be used for feedback control. However, these methods are usually very cumbersome and have to be used additionally. A particular advantage of the method is that the measurements on the gas under investigation can be used directly for frequency control and the control has a high absolute accuracy. This high accuracy is already achieved with a single measurement, which can be carried out within $0.5*10^{-6}$ seconds. A single spectrum can be recorded in this time and spectral accuracies of $0.01$ cm$^{-1}$ can be achieved.

Since a spectral property of the laser is used to control the emission frequency (instead of an external temperature measurement according to prior art solutions), the procedure described above is independent of temperature sensors. This concerns both the type of temperature sensor and its positioning in relation to the laser. Inaccuracies resulting from inherent inaccuracies of the temperature sensors used and from position differences of the temperature sensor compared to the laser in the processes known from prior art no longer play a role in the process used here. Furthermore, the method used in this case is independent of disturbing influences of an unknown heat input from the environment. Such a heat input at the temperature sensor leads to the fact that the temperature sensor used always measures a mixing temperature of the laser temperature and the ambient temperature. As a result, there are usually differences between the target temperature, i.e. the operating point of the laser, and the actual temperature, i.e. the current temperature of the laser. This means that the laser usually does not operate at its working point without correction. Only if the ambient temperature remains constant, an acceptable temperature readjustment of the laser is achieved with the solutions known from the state of the art. On the other hand, the method used here completely ignores such interferences; it only takes into account internal spectral properties of the laser for its temperature regulation.

In a variant of the procedure, an additional laser parameter is adapted if deviations are detected in the step in which it is determined whether the maximum of the first signal and the maximum of the second signal correspond in the first and second spectra. This additional laser parameter causes a stretching or compression of a spectrum that is recorded by the laser. Consequently, the position of a signal in the spectrum can be adjusted via temperature adjustment. If, after this adjustment, the second signal in the spectrum is at the expected (desired) position, no further adjustment of the spectrum is required. However, if the relative distance between the first signal and the second signal does not match the expected value, the spectrum must be compressed or stretched. This can also be adjusted via the additionally adjustable laser parameter. This laser parameter can, for example, be a current applied to the laser.

The working temperature of the laser can, for example, be influenced by a Peltier element. Such a Peltier element is typically controlled by a controller that receives an input variable. This input variable can be adjusted in dependence of the determined deviations of the actual position of at least one maximum in the second spectrum from the expected position in such a way that the laser temperature is increased or decreased so that the emission frequency of the laser again corresponds to the desired value.

In a variant, it is possible to make the adjustment of the laser parameter dependent on the adjustment of the working temperature of the laser or the temperature control parameter of the laser. In this way, information resulting from the adaptation of the working temperature of the laser (in particular an expected shift of the spectrum) can be used to adjust the laser parameter accordingly less than would be necessary without taking the adaptation of the working temperature into account. This allows a faster and more efficient adjustment of the emission frequency of the laser, which ultimately results in an exact spectrum.

In a variant, determining whether the maximum of the first signal and the maximum of the second signal in the second spectrum are each assigned to the same channel as in the first spectrum is performed by the steps explained below.

First, a first value is determined for the first channel and for a predeterminable number of further channels adjacent to the first channel. This first value is representative for a signal intensity assigned to the channels. It has to be considered that the adjacent channels have a higher ordinal number than the first channel, i.e. they are arranged in a spectrum to the right of the first channel. Figuratively speaking, the signal intensities assigned to these channels reflect the descending edge of a signal.

Furthermore, for the first channel and for a predeterminable number of further channels adjacent to the first channel, a second value is determined which is representative of a signal intensity assigned to these channels. In this case, the adjacent channels are channels with a lower ordinal number than the first channel. Again figuratively speaking, the signal intensities assigned to these channels of lower ordinal numbers reflect the rising edge of a signal in a spectrum to the left of the maximum.

A ratio is then formed between the first value and the second value (for example, the first value divided by the second value). This allows to determine whether the rising left edge of a signal or the falling right edge of a signal has a greater signal intensity. For example, the signal intensities can be integrated so that the areas of a signal that is divided in the middle can be compared with each other.

If the ratio of the two values to each other is a given numerical value, e.g. 1, the maximum of the respective signal is still assigned to the first channel. If the ratio of the first value to the second value is greater than the given numerical value (e.g. 1), the maximum of the signal in the spectrum has moved to the right (to a channel with a higher ordinal number). If the ratio of the first value to the second value is smaller than the given numerical value (e.g. 1), the maximum of the first signal in the spectrum has moved to the left (to a channel with a lower ordinal number).

By forming a ratio between the first value and the second value, absolute changes in signal intensity are shortened. Absolute signal changes occur e.g. due to changes in concentration or in gas absorption spectra due to changes in temperature and pressure. The first and second values change proportionally to each other and the ratio of the values does not change. Relative changes of the signal intensity (and thus the observed position of the signal in the spectrum) can still be observed. If the position of the signal changes, the first and second values no longer change proportionally to each other, but lead to a change in the ratio.

In a variant, the first ratio is used to adjust a temperature control parameter of the laser. Such a temperature control parameter is usually determined as a function of a temperature value supplied by a temperature sensor. This means that the temperature control of the laser expects such a temperature control parameter as input variable. If this temperature control parameter is now directly adjusted by the first ratio, the temperature control of the laser can be directly influenced. For example, the temperature control parameter can be adjusted by adding a correction term into which the first ratio is incorporated.

In a variant, the following steps are performed alternatively or additionally to determine whether the maximum of the first signal and the maximum of the second signal in the second spectrum have the same position as in the first spectrum. First, a third value is determined for the second channel and for a predeterminable number of channels adjacent to the second channel. This third value is representative for a signal intensity assigned to these channels. Similar to the first value, the adjacent channels are also channels with a higher ordinal number in the case of the third value (i.e. channels arranged in a spectrum to the right of the second channel).

A fourth value is then determined for the second channel and for a predeterminable number of channels adjacent to the second channel. The fourth value is also representative of a signal intensity assigned to these channels. In the case of the fourth value, the channels adjacent to the second channel are channels with a lower ordinal number (i.e. those channels which are shown in the graph of the spectrum to the left of the second channel), similar to the second value.

Now a second ratio is formed between the third value and the fourth value (for example, third value divided by fourth value).

The first value, the second value, the third value and/or the fourth value can independently reflect, for example, the area of a part of a signal in a spectrum. For this purpose, the corresponding sections of the signal can be integrated to obtain the corresponding area value.

However, the first value, the second value, the third value and/or the fourth value could also be values resulting from a derivative, such as the first derivative or the second derivative of the spectrum. In the latter case, the central channel would correspond to the value 0 of the first derivative, wherein a positive value of the first derivative would be assigned to channels with a higher ordinal number and a negative value of the first derivative would be assigned to channels with a lower ordinal number. Ultimately, it does not matter which mathematical method is used to determine the first value, the second value, the third value and/or the fourth value. It is only important that these values have their origin in the signal intensity assigned to a channel.

In a variant, the second ratio is used to adjust a laser parameter. This laser parameter is such a parameter that causes the stretching or compression of a spectrum recorded by the laser. Thus, while the position of a signal in the spectrum can be adjusted via the working temperature of the laser, the relative distance between two signals can be influenced by stretching or compressing the spectrum. In this way, the laser can be adjusted very finely so that successive measurements can be carried out under identical laser conditions.

Figuratively speaking, by selecting the adjacent channels surrounding the first channel and/or the second channel, the edges of a signal or peak in a spectrum can be defined and used to evaluate the position of the signal. Depending on the concrete design of the signal, it may be useful to select an asymmetrical distribution of the adjacent channels with a higher ordinal number and the adjacent channels with a lower ordinal number. The number of adjacent channels with a higher ordinal number can therefore be greater or smaller than the number of adjacent channels with a lower ordinal number.

In one variant, however, it is intended that the number of adjacent channels with a lower ordinal number should correspond to the number of channels with a higher ordinal number than the first channel or the second channel. In such a case, the same number of channels are selected above and below the channel (in case of graphic representation: right and left of the channel) in which the signal maximum is to lie. Once again, a symmetrical evaluation of the individual signals of the spectrum is applied.

It is conceivable and intended that in a variant for the first signal the number of adjacent channels with a lower ordinal number corresponds to the number of channels with a higher ordinal number, but differs for the second signal, or vice versa.

The first ratio and/or the second ratio can be calculated in a variant only for the second spectrum. In another variant, the first ratio and/or the second ratio are calculated for both the first spectrum and the second spectrum. This makes it particularly easy to detect changes in the signal position in the recorded spectrum. If the first ratio and/or the second ratio is also to be calculated for the first spectrum, the same procedure is used as for the calculation of the corresponding ratio for the second spectrum. This calculation can be made, for example, if the first channel and/or the second channel have been determined.

In addition to calculating the first ratio and/or the second ratio (which, with a view to a spectral evaluation of the division of a first subarea of the first signal by a second subarea of the first signal or the division of a first subarea of the second signal by a second subarea of the second signal, respectively, correspond to the division of a first subarea of the first signal with respect to a spectral evaluation of the division of a first subarea of the first signal by a second subarea of the second signal), there are also basically other possibilities for determining whether the maximum of the first signal in the second spectrum has been assigned to the first channel and whether the maximum of the second signal in the second spectrum has been assigned to the second channel.

In a variant, this determination is made by first determining a third channel to which the maximum of the first signal in the second spectrum has been assigned. Alternatively or additionally, a fourth channel is determined to which the maximum of the second signal in the second spectrum has been assigned.

In any case, it is then determined in this variant whether the third channel corresponds to the first channel and/or whether the fourth channel corresponds to the second channel. If this is the case, there is no need to adjust the laser. In case of deviations, the adjustments of the laser described above can be made so that the maximum of the first signal is detected again in the first channel (i.e. the desired setpoint) and/or so that the maximum of the second signal is detected again in the second channel (i.e. the desired setpoint).

This variant can be implemented in a particularly advantageous way by the fact that the third channel and/or the fourth channel are determined by a curve fitting. For this purpose, a curve is adapted to the measured values of the second spectrum; a mathematical fit of the measured values is therefore performed. A maximum of the curve corresponding to the maximum of the first signal is then used to determine the third channel. Alternatively or additionally, a maximum of the curve corresponding to the maximum of the second signal is used to determine the fourth channel.

All the above variants can be combined with each other in any way.

BRIEF DESCRIPTION OF THE DRAWINGS

Further advantages and details of the present invention are explained in more detail by means of exemplary embodiments and Figures.

DETAILED DESCRIPTION

Figure 1:
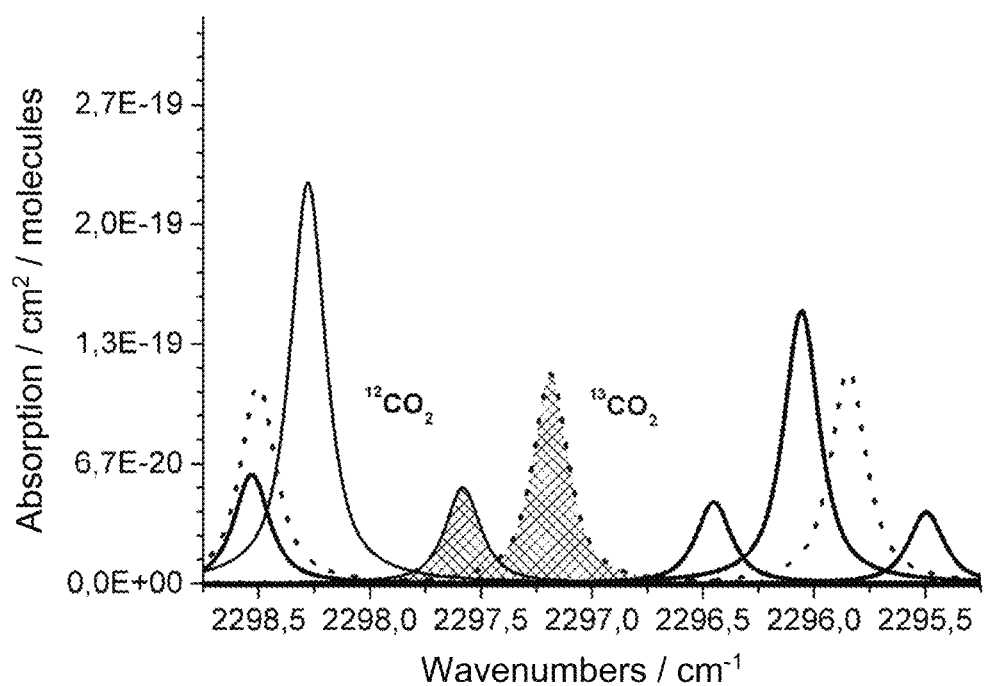
FIG. 1 shows a simulated absorption spectrum of carbon dioxide gas in the spectral range from 2299 $cm^{-1}$ to 2295 $cm^{-1}$.

FIG. 1 shows a simulated absorption spectrum (using the Lambert-Beer law) of carbon dioxide gas, wherein $^{12}CO_2$ bands are represented by a solid line and $^{13}CO_2$ bands by a dashed line.

Typically, the spectral range to be measured is tuned from a start frequency to an end frequency. If the frequency is generated by a fast temperature change of the laser, e.g. by a current flow, then there is an initial and final temperature, which are related to an initial and final frequency. However, the dependence between the applied heating voltage and the emission frequency is not linear so that either a calibration (e.g. with a germanium etalon) must be carried out for each measurement, or at least two absorption lines must be clearly identified whose frequency positions are known.

The frequency positions of typical gas absorption lines are well known and can be looked up in the HITRAN database (available online at http://hitran.org/) with uncertainties of less than one thousandth of a wavenumber.

The changes in the properties of the laser or the laser environment (e.g. temperature, pressure, humidity, current flow, voltage) discussed above often lead to a systematic drift to higher or lower frequencies. Frequently, the emission frequency of the laser oscillates also around the adjusted frequency value. The example of a rotational vibration absorption spectrum of carbon dioxide in the gas phase, which is recorded experimentally with a narrow-band infrared laser (IR laser), illustrates the associated technical challenge. Let us assume that in this example only the temperature changes the laser properties of a quantum cascade laser (as a light source).

The absorption lines shown in FIG. 1 are based on data taken from the HITRAN database. The line width of the absorption lines is 0.19 $cm^{-1}$ and results from the natural line width, the natural widening and the widening due to the measuring apparatus.

In the following, an exemplary measurement and an exact control of the laser frequency are presented.

Figure 2:
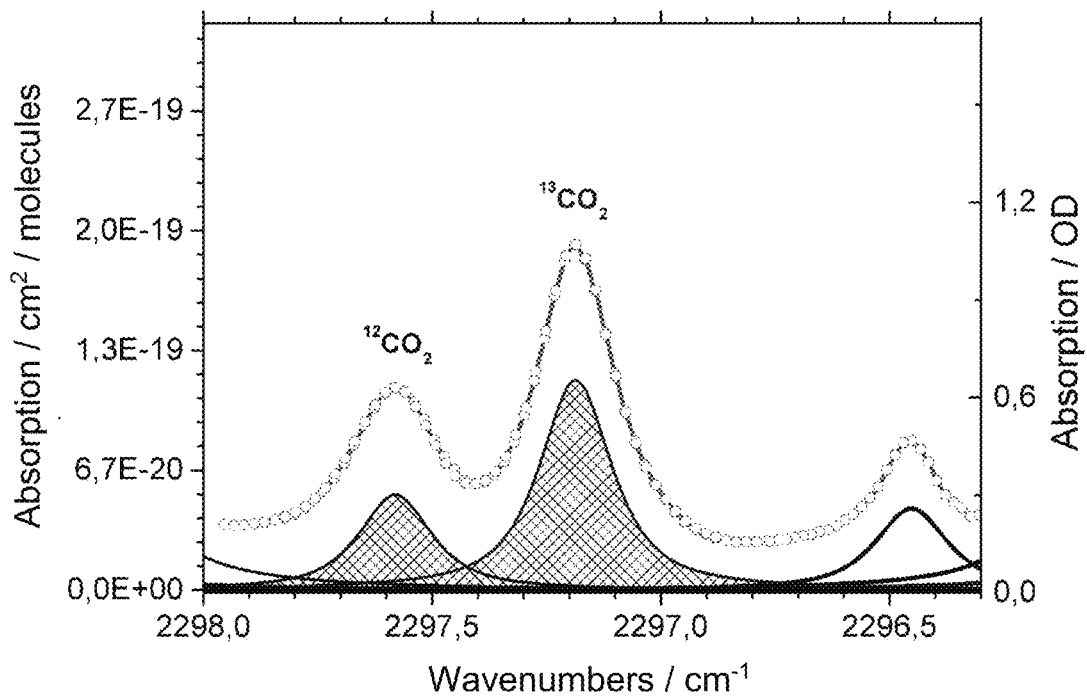
FIG. 2 shows a selected spectral range of the $^{12}CO_2$ band and the $^{13}CO_2$ band in an IR absorption spectrum.

The aim of the measurement is to determine the concentration of $^{12}CO_2$ and $^{13}CO_2$ in a sample. The selected spectral range extends from 2298 cm$^{-1}$ to 2296.3 cm$^{-1}$ and is shown in FIG. 2. The simulated $^{13}CO_2$ absorption band and the simulated $^{12}CO_2$ absorption band are marked with a crosshatch and a corresponding label. The points connected with an adjusted curve represent measured values of a sample measurement.

In order to tune the laser spectrally, a current ramp is applied, which generates a constant current increase, so that the temperature and thus the frequency increase. This was described in the following publication: Nelson, D.; Shorter, J.; McManus, J.; Zahniser, M.: Sub-part-per-billion detection of nitric oxide in air using a thermoelectrically cooled mid-infrared quantum cascade laser spectrometer. *Applied Physics B* 2002, 75, 343-350.

Then an absorption measurement can be carried out at freely selected (here almost equidistant) time intervals, which is assigned to a channel by means of a multichannel analyzer. The current ramp can have different shapes: It can ascend, ascend and then descend, or even oscillate. The measured channels must then be assigned to the real frequencies (in wavenumbers).

For this purpose, the absolute positions of the absorption peak positions are known, for example, from the HITRAN database. So one can now stretch or compress the measured absorption signal depending on the channel position so that it matches the peak positions from the HITRAN database. However, this would mean considerable post-processing of each individual spectrum before it could be averaged. Such an approach would, however, be possible in principle, but very costly.

If, however, the laser parameters shift so far due to a systematic temperature drift that, for example, the baseline of the spectrum changes, the measurements can no longer be averaged by post-processing each individual spectrum. This is because the measurement was no longer carried out under identical conditions. Averaging would lead to erroneous results.

For this reason, the measuring conditions and the frequency and temperature range must be kept constant or their deviations kept to a minimum. In order to achieve this, the procedure described below was developed as an implementation example of a procedure for controlling the emission frequency of the laser.

The examined spectral range shows three absorption bands. One $^{12}CO_2$ absorption band at 2297.58 cm$^{-1}$ (B1), one $^{13}CO_2$ absorption band at 2297.19 cm$^{-1}$ (B2) and one $^{12}CO_2$ absorption band at 2296.45 cm$^{-1}$ (B3) (see FIG. 2).

In order to find the correct laser working point, the temperature of the laser is set so that it emits light at a frequency of about 2298 cm$^{-1}$ without a current ramp. Then the current ramp is started and the measuring points are recorded when the current ramp is applied. Assuming the current ramp would pass through the spectral range by 1.7 cm$^{-1}$ within 1 ms (from high to low wavenumbers), then 20 to 20000 measurement points, i.e. 20 to 20000 individual absorption measurements, could easily be carried out in this time if the electronics are fast enough to process these absorption measurements.

In the present case, several hundred absorption measurements were carried out at different current values and thus different emission frequencies of the laser. The measured absorption spectrum shown in FIG. 2 is the result of the sequence of the measuring points. First, however, a spectrum is obtained in which the signal intensities are not yet assigned to the corresponding wavenumbers, but only to channels. Each measurement at a new current value corresponds to a new channel.

The position of B1 is assigned to the channel where the maximum of the first band (from left) is identified, the position of B2 is assigned to the channel where the maximum of the second band (from left) is identified, the position of B3 is assigned to the channel where the maximum of the third band (from left) is identified.

The linearity or non-linearity of the frequency positions can be determined as a function of the channels by assigning the three bands to the individual channels and a one-time etalon calibration. This is typically constant for a constant working point of the laser (also considering the corresponding tuning range of the laser at this working point). Thus, the current ramp, the initial temperature, the initial frequency, the non-linear dependence of the frequency on the channels for a defined operating point of the laser is characterized. Together with the settings for the operation of the laser, this defines the optimal operating point of the laser.

One now proceeds as follows for the further measurements: If (under ideal conditions) there are no changes in the environmental properties or the operating point of the laser, there is no change in the laser frequency. Unfortunately, this is never the case under real conditions. Since the laser temperature is controlled by a temperature controller, it is always controlled to a property (e.g. the temperature of the temperature sensor close to the laser) that does not correspond exactly to the laser property. In prior art solutions, the temperature of the laser is measured by a temperature element that is close to the laser and has good thermal contact. If the laser heats up, this is slightly delayed by the temperature element and measured in a slightly altered (attenuated) form. This is due to the temperature distribution in the components. This means that the temperature gradient leads to a heat flow that produces a temperature change in the temperature element to which it is then controlled.

Unfortunately, such a control always lags the real temperature and can lead to systematic temperature deviations with rising and falling outside temperatures. This is often the case, especially during longer laser operation, as the laser can continuously heat up due to the current or heat input into the laser. Even after switching on the laser, it takes up to one hour until the laser is in an acceptable equilibrium.

Figure 3:
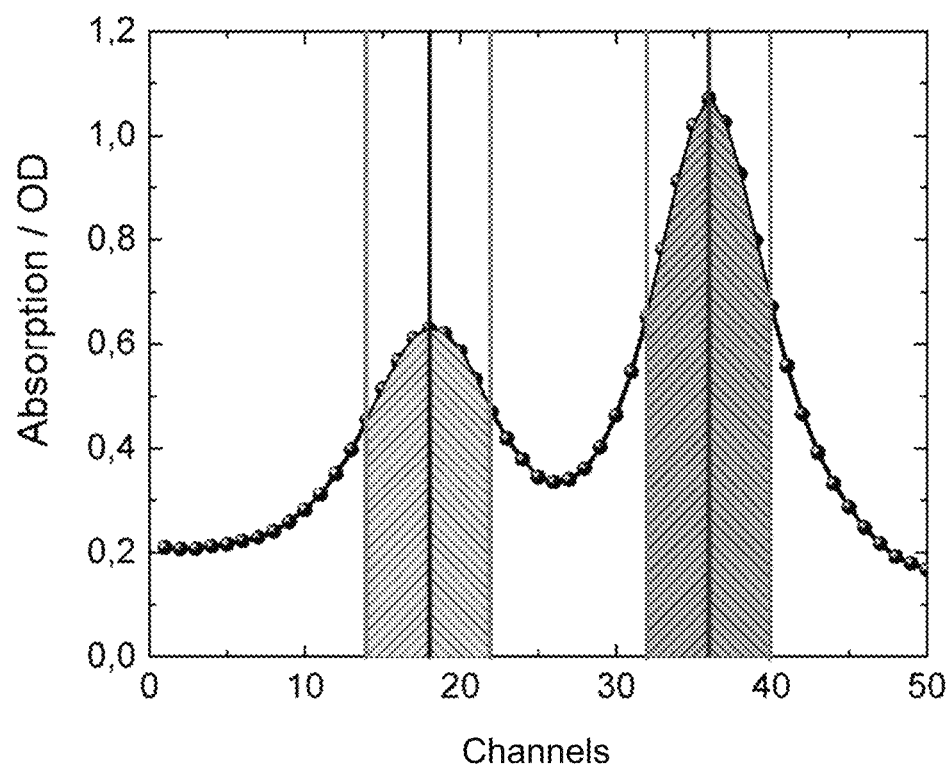
FIG. 3 shows an example of the procedure for determining a possible deviation of the position of the two absorption bands shown from a position in a previously recorded spectrum.

According to an exemplary embodiment of the procedure claimed here, however, the position of the absorption peaks is directly tracked, as shown in FIG. 3.

FIG. 1 shows an exemplary frequency stabilization based on the position of the $CO_2$ absorption bands. The hatched areas are compared symmetrically to the peak maximum of the individual absorption bands on one side of the respective absorption band (channels with a higher ordinal number) with the other side (channels with a lower ordinal number) of the same absorption band by forming a ratio. A change in the area ratio indicates a frequency shift.

If the temperature of the laser changes, the emission frequency of the laser changes. Consequently, the positions of the absorption bands shift. If the non-linearity or the dependence of the laser changes with current flow (for example as a reaction to heating), then the relative distance between the absorption bands shifts.

The operating point of the laser is set according to the described exemplary embodiment so that, for example, a peak maximum can be found for channel 18 and channel 36 in FIG. 3. If now the signal of the channels from 14 to 18 is integrated as parameter A and the signal of the channels from 18 to 22 as parameter B and the ratio of the integrals I1=A/B is formed, then an increase of I1 indicates a shift of the peak to lower channels and a decrease of I1 indicates a shift of the peak to higher channels.

One proceeds in the same way with the second peak. If now the signal of the channels from 32 to 36 is integrated as parameter C and the signal of the channels from 36 to 40 as parameter D and the ratio of the integrals I2=C/D is formed, then an increase of I2 indicates a shift of the peak to lower channels and a decrease of I2 indicates a shift of the peak to higher channels.

The integration of the flanks of the absorption bands is a possibility to calculate the shift of the maxima of the absorption bands from the ratios. It has the advantage that the signal-to-noise ratio increases during integration and that the shift of the maxima of the absorption bands can be determined well even with noisy spectra.

It is possible to include different flank components in the integration, which do not necessarily have to be symmetrically arranged. Flanks up to 90% of the maximum, especially up to 80%, especially up to 70%, especially up to 60%, especially up to 50%, especially up to 40%, especially up to 30%, especially up to 20%, especially up to 10% can be included. The more spectrally isolated the bands are, i.e. the less overlap there is with other bands, the larger the edge fraction included in the integration of the edges can become. There are also other possibilities to determine whether there has been a shift in the maxima of the absorption bands, e.g. by evaluating the inflection points and the maximum, etc.

A shift of both peaks can occur due to a changed initial temperature or frequency. This is specified in the regulation of the exemplary embodiment described here with the value TempSet (shift of the spectrum). If the relative distance between the peak positions is changed, the non-linearity between the frequency and the channels has changed. This is indicated by the value Imax in the control of the execution example described here. The current flow is increased from zero to Imax during a complete ramp. A change of Imax corresponds to a compression or extension of the spectrum.

A change of one or both peak positions is corrected directly after the measurement of a spectrum by variation of TempSet and Imax. Since the absorption spectrum directly reflects the current operating point of the laser, the operating point can be optimized directly in a feedback control.

The Temp Set value is a value that defines the working point of the laser. The change of the TempSet value ΔTempSet is described in the following table and results from the flank integrals A and B of the considered absorption band.

The value Imax is also a value that defines the working point of the laser. The change of the Imax value ΔImax is described in the following table and results from the flank integrals C and D of the considered absorption band.

Figure 4:
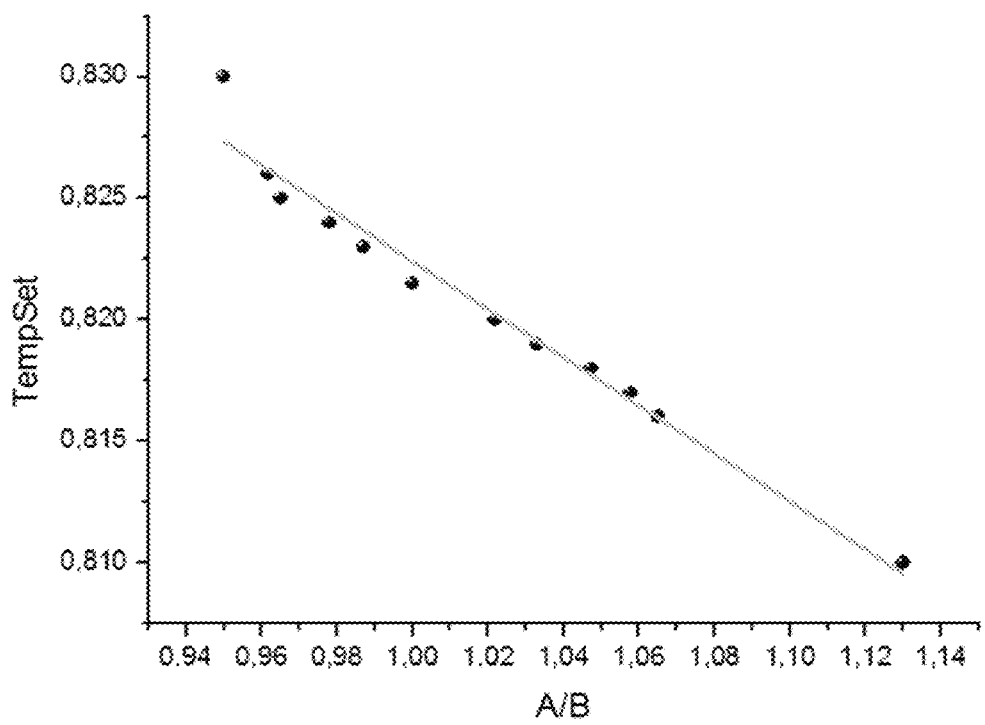
FIG. 4 shows a graphical representation of an exemplary embodiment of the dependence of the TempSet parameter on the ratio AB of the flank integrals of a first absorption band.
Figure 5:
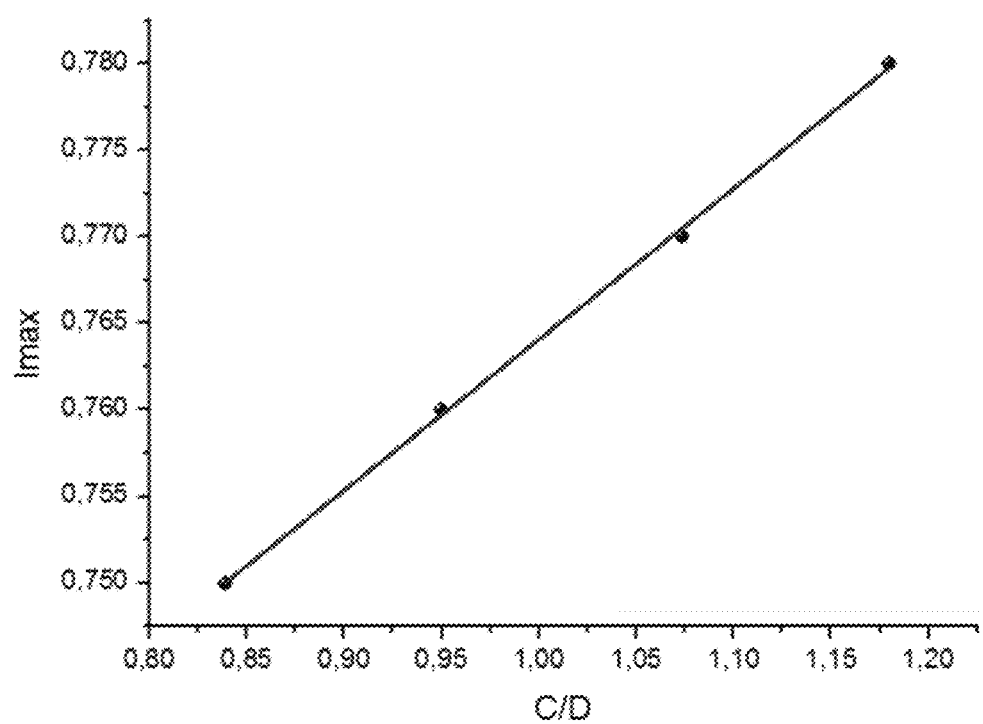
FIG. 5 shows a graphical representation of an exemplary embodiment of the dependence of the parameter Imax on the ratio C/D of the flank integrals of a second absorption band.

The dependence of the gradients α and δ are determined during the setting process of the optimal operating point. The value α can, for example, be determined by displaying the TempSet parameter over the ratio AB as shown in FIG. 4. The value δ can, for example, be determined by displaying the parameter Imax over the ratio C/D as shown in FIG. 5. The parameters TempSet and Imax are measured independently of each other at the optimum points of the other values.

The following three regulations are presented as examples.

Example 1

A linear equation is used to correct the operating point and the compression of the spectrum. The two controlled variables are decoupled from each other.

| Displacement of the entire spectrum | Spectrum compression |
|---|---|
| $\Delta \text{Temp\_Set} = \left(\alpha\left(\dfrac{A}{B} - 1\right)\right) * \text{factor } LNR$ | $\Delta \text{I\_max} = \left(\delta\left(\dfrac{C}{D} - 1\right)\right) * \text{factor } LNR$ |
| $\text{Temp\_Set}_{new} = \text{Temp\_Set}_{old} + \Delta \text{Temp\_Set}$ | $\text{I\_max}_{new} = \text{I\_max}_{old} + \Delta \text{I\_max}$ |
| α: Rise of TempSet vs. A/B | δ: Rise of I max vs. C/D |
| A, B: left or right area of peak; sum of channels left or right of the defined central channel. | C, D: left or right areas of peak; sum of channels left or right of the defined central channel |
| LNR: Correction factor -> Determination via standard deviation of A/B and C/D with active control; typical values: 0.01; 0.05; 0.1 | LNR: Correction factor -> Determination via standard deviation of A/B and C/D with active control; typical values: 0.01; 0.05; 0.1 |
| Temp_Set: Value which is given to the control loop of the electronics. | I_max: Value which is given to the control loop of the electronics. |

In the control listed here, the positions of two absorption peaks (P1 and P2) are controlled via a feedback control. The TempSet setting should adjust the position of peak P1 so that the maximum is in channel K1. The gradient α now describes the change of the value TempSet depending on the edge ratio A/B. The ratio A/B describes the integrals of the left and right edges of peak P1. If the peak is shifted, the ratio A/B changes. In the example shown in the table, peak P1 is positioned at the desired channel when the ratio is 1. If the ratio deviates from 1, a correction value results (A/B−1). This is multiplied by the gradient α and thus serves for the exact setting of the TempSet value required for the desired working temperature of the laser.

The Imax setting is to set the position of peak P2 so that the maximum is in channel K2. The gradient δ now describes the change of the value Imax depending on the edge ratio C/D. The ratio C/D describes the integrals of the left and right flank of peak P2. If the peak is shifted, the ratio C/D changes. In the example shown in the table, Peak P2 is positioned at the desired channel when the ratio is 1. If the ratio deviates from 1, a correction value results (C/D−1). This is multiplied by the gradient δ and thus serves for the exact setting of the Imax value required for the desired working temperature of the laser.

Since, however, an additional temperature control very often regulates the laser temperature, it often makes sense in practice to adapt the control steps to the feedback control and to select a value smaller than 1. Furthermore, it must be taken into account that the gradients α and δ have a statistical error, which must be included in the size of the control steps. This error is quantified in a calibration step.

For this purpose, the standard deviation of the dispersion of the ratio A/B is determined as a function of the factor LNR with active control. Both influencing factors mentioned above are taken into account by the LNR factor. Ideally, LNR would be one.

Figure 6:
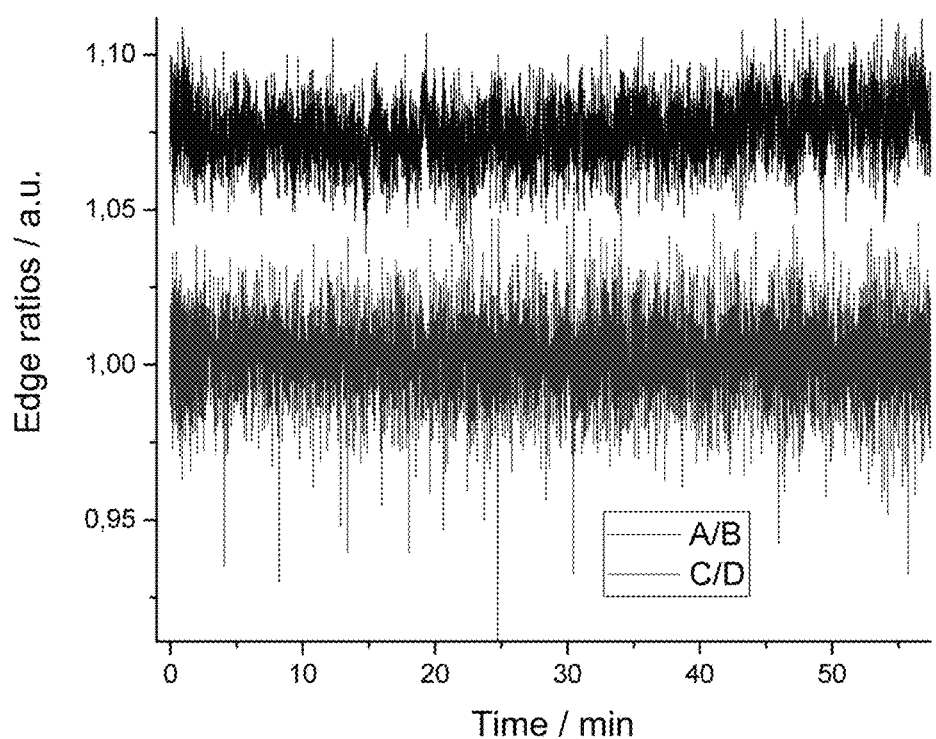
FIG. 6 shows a graphical representation of typical curves of flank ratios of two absorption bands as a function of time under real measuring conditions using an example of the procedure for controlling the emission frequency of a laser.

The control of the emission frequency of a laser shown as an example above makes it possible to obtain very stable positions of absorption bands in a spectrum. This is shown as an example in FIG. 6, which shows the progression of the flank ratios A/B (upper line) and C/D (lower line) as a function of time for a measurement in a clinical environment with fluctuating temperature conditions. On average, the edge ratios are very constant, since the control of the emission frequency of the laser described above was applied. Without such control of the emission frequency, the edge ratios would change massively, corresponding to a shift in the absorption bands considered in the spectrum. It does not matter whether the regulated conditions are at one or deviate from it. To stabilize the frequency, only a constant mean value of the ratios with small deviations (small standard deviation) is important to successfully control the emission frequency.

Example 2

A linear equation is used to correct the operating point and the compression of the spectrum. The two control variables are coupled.

of the left and right flank of peak P2. If the peak is shifted, the ratio C/D changes. In the example shown in the table, peak P2 is positioned at the desired channel if the ratio is e.g. 1. If the ratio deviates from e.g. 1, a correction value results (C/D−1). This is multiplied by the gradient δ'. Since TempSet is set in the same or a subsequent control step, this position shift would also influence the position of P2. To counteract this, an additional term □' is introduced which defines this dependency on the TempSet.

The correction of the individual values for TempSet and Imax can be carried out simultaneously (parallel) or successively (sequentially). For a parallel version of the control, the complete set of curves must be recorded for the TempSet (Imax) and Imax(TempSet) variables. In the case of a sequential execution (correction of TempSet followed by Imax) a case distinction can be made: If the relative error is ΔTempSet/TempSet≥ΔImax/Imax, i.e. if the influence of the change on the position of peak P1 is greater than on peak P2, then β' can be set to zero, whereby the value for TempSet is changed so that peak P1 has its maximum in channel K1. P2 is corrected according to the above formula, but the shift of peak P2 due to the change of TempSet is taken into account. If the relative error is ΔImax/Imax≥ΔTemSet/TemSet, i.e. if the influence of the change on the position of peak P2 is greater than on peak P1, δ' can be set to zero, whereby the value for Imax is changed so that peak P2 has its maximum in channel K2. P1 is corrected according to the above

| spectral shift | Spectrum compression |
|---|---|
| $\Delta \text{Temp\_Set} = \left( \alpha' \left( \frac{A}{B} - 1 \right) + \beta' (TempSet(I_{max})) \right) * \text{factor } LNR$ | $\Delta I\_\text{max} = \left( \gamma' \left( \frac{A}{B} - 1 \right) + \delta' (I_{max}(TempSet)) \right) * \text{factor } LNR$ |
| Temp_Set$_{new}$ = Temp_Set$_{old}$ + ΔTemp_Set | I_max$_{new}$ = I_max$_{old}$ + ΔI_max |
| α': Rise of TempSet vs. A/B | δ': Rise of I_max vs. C/D |
| β': dependency on TempSet when changing Imax | γ': Dependence on I_max when changing TempSet |
| A, B: left or right area of peak; sum of channels left or right of the defined central channel. | C, D: left or right surfaces of peak; sum of channels left or right of the defined central channel |
| LNR: Correction factor -> Determination via standard deviation of A/B and C/D with active control; typical values: 0.01; 0.05; 0.1 | LNR: Correction factor -> Determination via standard deviation of A/B and C/D with active control; typical values: 0.01; 0.05; 0.1 |
| Temp_Set: Value which is given to the control loop of the electronics. | I_max: Value which is given to the control loop of the electronics. |

In the regulation listed here, the positions of two absorption peaks (P1 and P2) are regulated via a feedback regulation. The TempSet setting should adjust the position of peak P1 so that the maximum is in channel K1. The gradient α' now describes the change of the value TempSet depending on the edge ratio A/B. β' describes the change of the TempSet value when Imax is changed. The ratio A/B describes the integrals of the left and right edges of peak P1. If the peak is shifted, the ratio A/B changes. In the example shown in the table, peak P1 is positioned at the desired channel if the ratio is 1, for example. If the ratio deviates from e.g. 1, a correction value results (A/B−1). This is multiplied by the gradient α'. Since Imax is set in the same or a subsequent control step, this position shift would also influence the position of P1. To counteract this, an additional term β' is introduced, which takes this dependence on Imax into account.

The Imax setting is to set the position of peak P2 so that the maximum is in channel K2. The gradient γ' now describes the change of the value Imax depending on the edge ratio C/D. δ' describes the change of the value Imax depending on TempSet. The ratio C/D describes the integrals formula, but the shift of peak P1 due to the change of Imax is taken into account. It is not possible to "overcontrol" the regulation.

Since, however, an additional temperature control very often regulates the laser temperature, it often makes sense in practice to adapt the control steps to the feedback control and to select a value smaller than 1. Furthermore, it must be taken into account that the gradients α and δ have a statistical error, which must be included in the size of the control steps. Furthermore, it must be taken into account that the gradients α', δ', β' and γ' have a statistical error that must be included in the size of the control steps. This error is quantified in a calibration step. For this purpose, the standard deviation of the dispersion of the ratio A/B is determined as a function of the factor LNR with active control. Both influencing factors mentioned above are taken into account by the LNR factor. Ideally, LNR would be one.

Example 3

Intervals are specified in which the feedback loop is regulated.

| | |
|---|---|
| A/B > ($a_i$ * peak deviation$_{AB}$ + 1) | C/D > ($c_j$ * peak deviation$_{CD}$ + 1) |
| B/A > ($a_i$ * peak deviation$_{AB}$ + 1) | D/C > ($c_j$ * peak deviation$_{CD}$ + 1) |
| Temp_Set$_{new}$ = Temp_Set$_{old}$ ± $b_i$ | I_max = I_max ± $d_j$ |
| A, B: left or right area of peak; sum of channels left or right of the defined central channel. | C, D: left or right area of peak; sum of channels left or right of the specified central channel |
| $a_i$, $b_i$: preset parameters for interval i | $c_j$, $d_j$: default parameters for interval j |
| peak deviation$_{AB}$: preset parameter | peak deviation$_{CD}$: preset parameter |
| Temp_Set: Value which is given to the control loop of the electronics. | I_max: Value which is given to the control loop of the electronics. |
| For each interval i different parameters for $a_i$ and $b_i$ can be used | For each interval j, different parameters can be used for $a_j$ and $b_j$. |

The third control is independent of a predetermined dependency of TempSet on A/B or of Imax on C/D.

In this variant, two peak positions P1 and P2 are assigned to channels K1 and K2. For the deviation of the values of the ratios A/B and C/D by a preset value, e.g. 1, intervals can be defined for which TempSet is changed by a preset value. This interval division is represented by the value peak deviation$_{AB}$*α. An interval (peak deviation$_{AB}$*$α_1$) is sufficient for small changes to the TempSet value. For example, if there is a deviation from A/B from the value 1, which is greater than the value peak deviation$_{AB}$*$α_1$, the value Temp-Set changes by the amount (+$b_1$). The value for peak deviation is very small and can be 0.002. If, for example, $α_1$ has the value one, the value TempSet is changed by $b_1$ (e.g. 0.0005) if there is a deviation of 0.002. Further intervals can be defined for larger deviations. However, the intervals may not have to be equidistant. So for the intervals peak deviation$_{AB}$*$α_2$ (e.g. value two), peak deviation$_{AB}$*$α_3$ (e.g. value three) and peak deviation$_{AB}$*$α_4$ (e.g. value five) larger b2, b3, b4 values for the changes of TempSet can be selected. Within an interval (values between peak deviation$_{AB}$*$α_1$ and peak deviation$_{AB}$*$α_{i-1}$) TempSet is always corrected by a fixed amount ($b_i$) for this interval. If the value lies in a different interval, TempSet is corrected by a different amount $b_i$. For each interval there is a defined $b_i$.

The regulation is carried out iteratively. This means that in a first control step, the ratio A/B is determined and compared against the specified intervals. Depending on the interval in which the ratio A/B lies, the value for TempSet is corrected by the corresponding value $b_i$. In a subsequent step, this procedure is repeated and Temp Set corrected again if necessary. By performing these individual steps one after the other, a control loop is created which corrects the peak position P1 per loop pass with the aim of keeping the ratio A/B within the smallest interval and thus peak position P1 at channel K1.

With this method, deviations to lower or higher temperatures can be introduced with different control steps. This is useful if the cooling of the laser is close to its limit and, for example, cooling takes longer than heating.

The deviation B/A shows a peak deviation in the other direction than A/B. Accordingly, TempSet is controlled in the opposite direction (TempSet$_{new}$=TempSet$_{old}$-$b_i$), analogous to the method described above.

The second peak P2 is controlled on channel K2. The procedure is analogous to the TempSet control. However, the intervals from when control is started ($c_1$, $c_2$, $c_3$, $c_4$, etc.) and how much is controlled ($d_1$, $d_2$, $d_3$, $d_4$, etc.), as well as the peak deviation$_{CD}$ are determined separately for Imax from the ratios C/D and D/C.

The invention claimed is:

1. A method for controlling the emission frequency of a laser, comprising the following steps:

a) recording a first spectrum by passing a laser light emitted by the laser through a sample onto a detector, the detector being connected to a multichannel analyzer which assigns pulses detected by the detector to a channel, b) determining a first channel to which the maximum of a first signal in the first spectrum has been assigned, c) determining a second channel to which the maximum of a second signal in the first spectrum has been assigned, d) recording a second spectrum in the same way as the first spectrum, e) determining whether the maximum of the first signal in the second spectrum was assigned to the first channel and whether the maximum of the second signal in the second spectrum was assigned to the second channel, wherein the following is carried out for this determining:

determining a first value for the first channel and for a predeterminable number of higher order channels adjacent the first channel, the first value representing a signal intensity assigned to these channels, determining a second value for the first channel and for a predeterminable number of lower order channels adjacent the first channel, the second value representing a signal intensity assigned to these channels, and forming a first ratio between the first value and the second value, and f) adaptation of a working temperature of the laser with deviations determined in step e) such that the maximum of the first signal in the second spectrum is assigned to the first channel and/or that the maximum of the second signal in the second spectrum is assigned to the second channel.

2. The method according to claim 1, wherein, in the case of deviations determined in step e), a laser parameter is additionally adapted which causes an extension or compression of a spectrum recorded with the aid of the laser.

3. The method according to claim 1, wherein the first ratio is used to adjust a temperature control parameter of the laser.

4. The method according to claim 1, wherein the following is carried out for determining in step e):

determining a third value for the second channel and for a predeterminable number of higher order channels adjacent the second channel, the third value representing a signal intensity assigned to these channels, determining a fourth value for the second channel and for a predeterminable number of lower order channels adjacent the second channel, the fourth value representing a signal intensity assigned to these channels, and forming a second ratio between the third value and the fourth value.

5. The method according to claim 4, wherein the second ratio is used to adjust a laser parameter which causes an elongation or compression of a spectrum recorded with the aid of the laser.

6. The method according to claim 1, wherein the number of adjacent lower order channels corresponds to the number of adjacent higher order channels.

7. The method according to claim 1, wherein the following is carried out for determining in step e):
 determining a third channel to which the maximum of the first signal in the second spectrum has been assigned, and/or
 determining a fourth channel to which the maximum of the second signal in the second spectrum has been assigned, and
 determining whether the third channel corresponds to the first channel and/or whether the fourth channel corresponds to the second channel.

8. The method according to claim 7, wherein the determination of the third channel and/or the fourth channel is carried out by adapting a curve to measured values of the second spectrum, wherein a maximum of the curve corresponding to the maximum of the first signal is used for the determination of the third channel and/or a maximum of the curve corresponding to the maximum of the second signal is used for the determination of the fourth channel.

9. The method according to claim 2, wherein the following is carried out for determining in step e):
 determining a third channel to which the maximum of the first signal in the second spectrum has been assigned, and/or
 determining a fourth channel to which the maximum of the second signal in the second spectrum has been assigned, and
 determining whether the third channel corresponds to the first channel and/or whether the fourth channel corresponds to the second channel.

10. The method according to claim 9, wherein the determination of the third channel and/or the fourth channel is carried out by adapting a curve to measured values of the second spectrum, wherein a maximum of the curve corresponding to the maximum of the first signal is used for the determination of the third channel and/or a maximum of the curve corresponding to the maximum of the second signal is used for the determination of the fourth channel.

* * * * *